(12) United States Patent
Ryu et al.

(10) Patent No.: US 11,791,014 B2
(45) Date of Patent: Oct. 17, 2023

(54) MEMORY DEVICES HAVING VARIABLE REPAIR UNITS THEREIN AND METHODS OF REPAIRING SAME

(71) Applicant: Samsung Electronics Co., Ltd., Suwon-si (KR)

(72) Inventors: Yesin Ryu, Seoul (KR); Yoonna Oh, Seongnam-si (KR); Hyunki Kim, Yongin-si (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 18/053,498

(22) Filed: Nov. 8, 2022

(65) Prior Publication Data
US 2023/0069753 A1    Mar. 2, 2023

Related U.S. Application Data

(63) Continuation of application No. 16/890,559, filed on Jun. 2, 2020, now Pat. No. 11,527,303.

(30) Foreign Application Priority Data

Oct. 28, 2019    (KR) .................. 10-2019-0134559

(51) Int. Cl.
*G06F 11/00*        (2006.01)
*G11C 29/00*        (2006.01)
(Continued)

(52) U.S. Cl.
CPC .......... *G11C 29/88* (2013.01); *G06F 11/2094* (2013.01); *G06F 12/10* (2013.01);
(Continued)

(58) Field of Classification Search
CPC .. G06F 11/2094; G06F 12/10; G06F 2201/82; G11C 29/88; G11C 17/16; G11C 17/18
See application file for complete search history.

(56) References Cited

U.S. PATENT DOCUMENTS 5,867,435 A     2/1999   Ogino
6,813,199 B2   11/2004   Hidaka
(Continued)

FOREIGN PATENT DOCUMENTS

JP            4433130 B2 *  3/2010  ........... G11C 29/785

OTHER PUBLICATIONS

German Office Action corresponding to German Application No. 10 2020 118 505.7 (16 pages) (dated Jun. 8, 2022).
(Continued)

*Primary Examiner* — Samir W Rizk
(74) *Attorney, Agent, or Firm* — Myers Bigel, P.A.

(57) ABSTRACT

A memory device includes a row decoder, a column decoder, and a repair control circuit, which is configured to: (i) compare a row address with a stored failed row address, (ii) compare a column address with a stored failed column address, (iii) control the row decoder to activate the at least one of a plurality of redundancy word lines when the row address corresponds to the failed row address, and (iv) control the column decoder to activate at least one of a plurality of redundancy bit lines when the column address corresponds to the failed column address. The repair control circuit varies a repair unit according to an address input during a repair operation.

19 Claims, 15 Drawing Sheets

(51) Int. Cl.
  *G06F 11/20* (2006.01)
  *G06F 12/10* (2016.01)
  *G11C 17/16* (2006.01)
  *G11C 17/18* (2006.01)

(52) U.S. Cl.
  CPC .............. *G11C 17/16* (2013.01); *G11C 17/18* (2013.01); *G06F 2201/82* (2013.01)

(56) References Cited

U.S. PATENT DOCUMENTS

| | | |
|---|---|---|
| 7,376,025 B2 | 5/2008 | Merritt et al. |
| 7,933,159 B2 | 4/2011 | Kobayashi et al. |
| 9,412,470 B2 | 8/2016 | Son et al. |
| 9,767,922 B2 | 9/2017 | Lee et al. |
| 2003/0038257 A1 | 2/2003 | Ho |
| 2003/0191991 A1* | 10/2003 | Hsu ...................... G11C 29/808 714/710 |
| 2008/0022149 A1* | 1/2008 | Ouellette ............... G11C 29/44 714/6.12 |
| 2011/0292747 A1* | 12/2011 | Seo ........................ G11C 29/24 365/225.7 |
| 2012/0275248 A1 | 11/2012 | Won |
| 2013/0163352 A1* | 6/2013 | Do ........................ G11C 29/785 365/189.17 |
| 2013/0272075 A1 | 10/2013 | Blodgett |
| 2020/0243158 A1* | 7/2020 | Wilson ................... G11C 29/76 |

OTHER PUBLICATIONS

Itoh, Kiyoo "VLSI Memory Chip Design" Chapter 3.9 Redundancy Techniques (pp. 178-194) (2001).

\* cited by examiner

MEMORY DEVICES HAVING VARIABLE REPAIR UNITS THEREIN AND METHODS OF REPAIRING SAME

REFERENCE TO PRIORITY APPLICATION

This application is a continuation of and claims priority to U.S. patent application Ser. No. 16/890,559, filed Jun. 2, 2020, which claims priority to Korean Patent Application No. 10-2019-0134559, filed Oct. 28, 2019 in the Korean Intellectual Property Office, the disclosures of which are hereby incorporated herein by reference.

BACKGROUND

The present inventive concept relates to memory devices having variable memory cell repair capability and methods of repairing same using memory cell redundancy.

In general, as miniaturization in the process of manufacturing a dynamic random access memory (DRAM) proceeds, the occurrence rate of memory cells having hard or soft defects (i.e., failed memory cells) increases. In this case, a memory cell having a hard defect may represent a memory cell having relatively permanent defects, and the memory cell having a soft defect may represent a memory cell having relatively slight defects to be temporarily defective. In order to guarantee the full memory capacity of the DRAM, a repair method of replacing failed cells with spare cells or redundancy cells, which are provided separately from the normal cells, may be adopted as a method of repairing the failed cells. For example, a repair method in which an entire row including a failed cell is replaced with a spare row or a redundancy row (i.e., a row repair), or a column including a failed cell is replaced with a spare column or a redundancy column (i.e., a column repair) may be employed.

SUMMARY

An aspect of the present inventive concept is to provide a memory device varying a repair unit and a repair method thereof.

According to an aspect of the present inventive concept, a memory device is provided, which includes an address buffer configured to store a plurality of bits of a received address (e.g., row address, column address), and a first non-volatile memory configured to store a plurality of bits of a failed address. A plurality of first logic circuits are also provided and each of these first logic circuits is configured to compare one bit of the received address stored in the address buffer with a corresponding bit of the failed address stored in the first non-volatile memory. A first selector is provided, which is configured to output a selected one of two output values from two of the first logic circuits, among the first logic circuits, in response to a selection signal. A second logic circuit is provided, which is configured to output an address matching signal based on the selected output value, and output values of remaining first logic circuits, except for the two of the first logic circuits. A second non-volatile memory is provided, which is configured to store an address bit value corresponding to the selection signal. A second selector is provided, which is configured to output one bit of address bits, corresponding to the two of the first logic circuits, in response to a true or inverted version of the selection signal. A third logic circuit is provided, which is configured to perform an AND operation on the address matching signal and an output value of the second selector. According to some of these embodiments of the invention, each of the first logic circuits is configured to perform an XNOR (or XOR) operation, whereas the second logic circuit performs an AND (or NAND) operation.

A memory device according to another embodiment of the invention can include a memory cell array having a redundancy area (corresponding to redundancy word lines and/or redundancy bit lines) and a normal area corresponding to word lines and bit lines. A row decoder is provided, which is configured to activate at least one of the word lines and/or activate at least one of the redundancy word lines, in response to a row address. A column decoder is provided, which is configured to activate at least one of the bit lines and/or activate at least one of the redundancy bit lines, in response to a column address. A repair control circuit is provided, which is configured to: (i) compare the row address with a stored failed row address, (ii) compare the column address with a stored failed column address, (iii) control the row decoder to activate the at least one of the redundancy word lines when the row address corresponds to the failed row address, and (iv) control the column decoder to activate the at least one of the redundancy bit lines when the column address corresponds to the failed column address. According to further aspects of these embodiments, the repair control circuit may operate to vary a repair unit according to an address input during a repair operation.

According to another aspect of the present inventive concept, a memory device includes a memory cell array having a redundancy area corresponding to redundancy word lines or redundancy bit lines, and a normal area corresponding to word lines and bit lines. The memory device also includes a row decoder configured to activate at least one of the word lines or activate at least one of the redundancy word lines, in response to a row address, and a column decoder configured to activate at least one of the bit lines or activate at least one of the redundancy bit lines, in response to a column address. A repair control circuit is provided, which is configured to compare the row address with a stored failed row address, to compare the column address with a stored failed column address, to control the row decoder to activate the at least one of the redundancy word lines when the row address corresponds to the failed row address, and to control the column decoder to activate the at least one of the redundancy bit lines when the column address corresponds to the failed column address. The repair control circuit may vary a repair unit according to an address input during a repair operation.

According to another embodiment of the inventive concept, a repair method of a memory device includes receiving an address, determining a repair unit using at least one address bit to be ignored in a repair operation (among address bits of the received address), and comparing the received address with a stored failed address. And, when the received address corresponds to the stored failed address, an operation is performed to access a redundancy cell array with the repair unit in response to the address.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Figure 1:
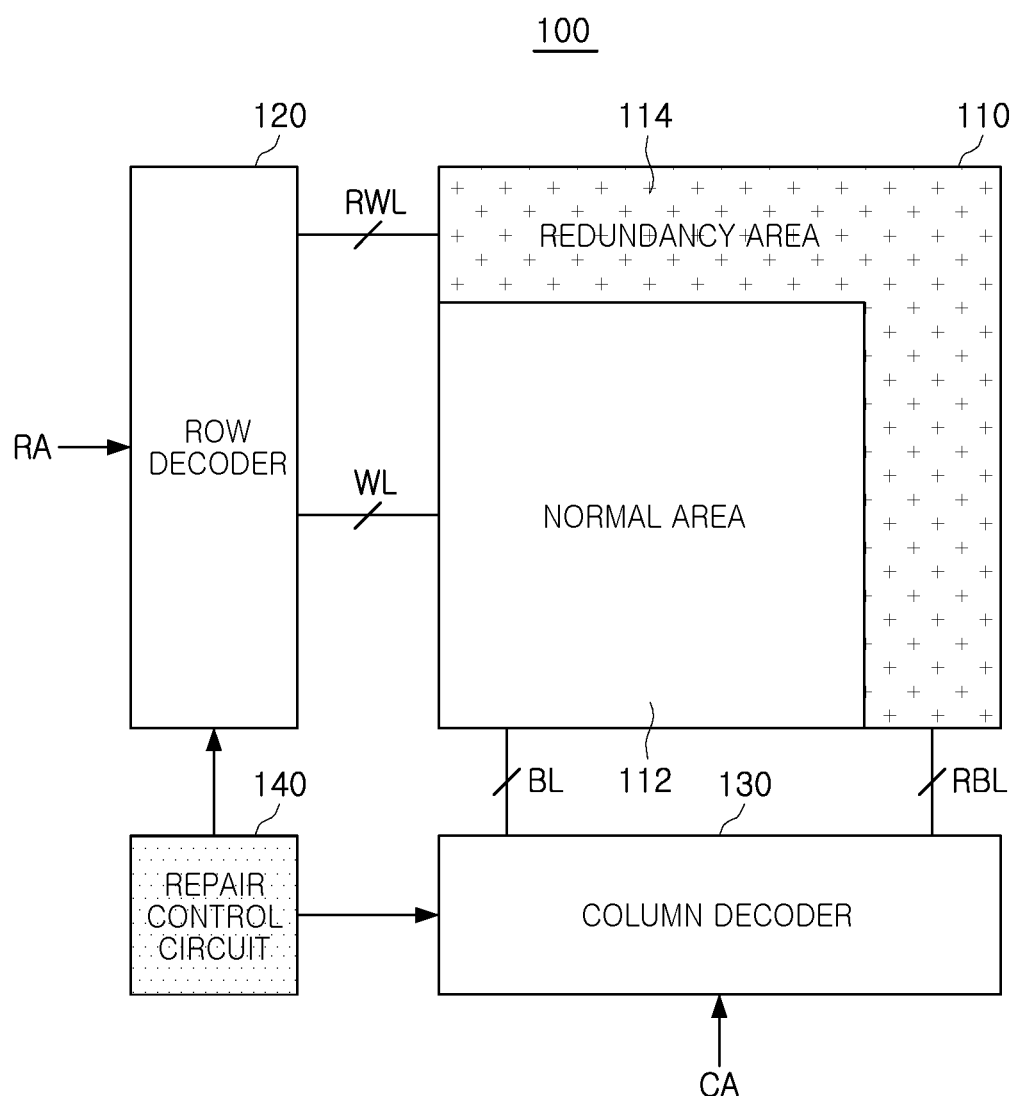
FIG. 1 is a diagram illustrating a memory device 100 according to an example of the present inventive concept.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprising", "including", "having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a diagram illustrating a memory device 100 according to an example of the present inventive concept. Referring to FIG. 1, a memory device 100 may include a memory cell array 110, a row decoder 120, a column decoder 130, and a repair control circuit 140. The memory cell array 110 may include a normal area 112 in which a plurality of memory cells are disposed, and a redundancy area 114 in which a plurality of redundancy memory cells are disposed. In an example, the normal area 112 may include plurality of memory cells that may be respectively disposed in an intersection area of a plurality of word lines WL and a plurality of bit lines BL. In this case, each of the plurality of memory cells may include a volatile memory cell or a non-volatile memory cell. In an example, a first portion of the redundancy area 114 may be disposed adjacent to the normal area 112 in an extending direction of the word lines WL. For example, the redundancy area 114 may include a plurality of redundancy memory cells that may be respectively disposed in an intersection area of a plurality of redundancy bit lines RBL and the plurality of word lines WL. Also, a second portion of a redundancy area 114 may be disposed adjacent to the normal area 112 in an extending direction of the bit lines BL. For example, the redundancy area 114 may include a plurality of redundancy memory cells that may be respectively disposed in an intersection area of a plurality of redundancy word lines RWL and the plurality of bit lines BL.

Failure may occur in at least one cell of the memory cells disposed in the normal area 112. A failed cell in which the failure occurs may be a single bit, a weak cell, or a defective cell. The failed cells generated in the normal area 112 may be replaced by redundancy memory cells included in the redundancy area 114. This replacement operation may be called a "repair operation." By the repair operation, data to be stored or read in the failed cells may be stored in or read from the "replacement" redundancy memory cell.

The row decoder 120 may select at least one word line from among the plurality of word lines WL and activate the selected word line, in response to a row address (RA). In addition, the row decoder 120 may select at least one redundancy word line from among the plurality of redundancy word lines RWL and activate the selected redundancy word line, in response to a row address matching signal. For example, the row decoder 120 may deactivate the row address (RA) and activate the redundancy row word line, in response to the row address matching signal.

The column decoder 130 may select at least one bit line from among the plurality of bit lines BL and activate the selected bit line, in response to a column address (CA). In addition, the column decoder 130 may select at least one redundancy bit line from among the plurality of redundancy bit lines RBL and activate the selected redundancy bit line, in response to a column address matching signal. For example, the column decoder 130 may deactivate the column address (CA) and activate the redundancy column bit line, in response to the column address matching signal.

The repair control circuit 140 may be implemented to perform a repair operation on a failed cell among a plurality of memory cells. For example, when input row address (RA) corresponds to a failed cell, the repair control circuit 140 may generate a row address matching signal. In addition, when input column address (CA) corresponds to a failed cell, the repair control circuit 140 may generate a column address matching signal.

In addition, the repair control circuit 140 may vary a range of the repair area according to a type of the failure. In this case, the repair area may be an area corresponding to a single redundancy address (CRENI). For example, the repair control circuit 140 may vary a type of address bits or the number of address bits, corresponding to the failed cells. The repair control circuit 140 may store repair mapping information regarding the type of the address bits or the number of the address bits in a non-volatile memory (e.g., a fuse).

A general memory device may compare an input address with a stored failed address, and may perform a repair operation changing to a repaired address according to comparison results. The repair operation may perform a repair in a fixed repair unit.

In the memory device 100 according to an example of the present inventive concept, it may be expected to increase a yield by operating a repair operation differently according to a failure type of the memory cell, and, even in a case of the same redundancy resource, by changing a repair unit, e.g., a type and the number of addresses according to the failure type.

Figure 2:
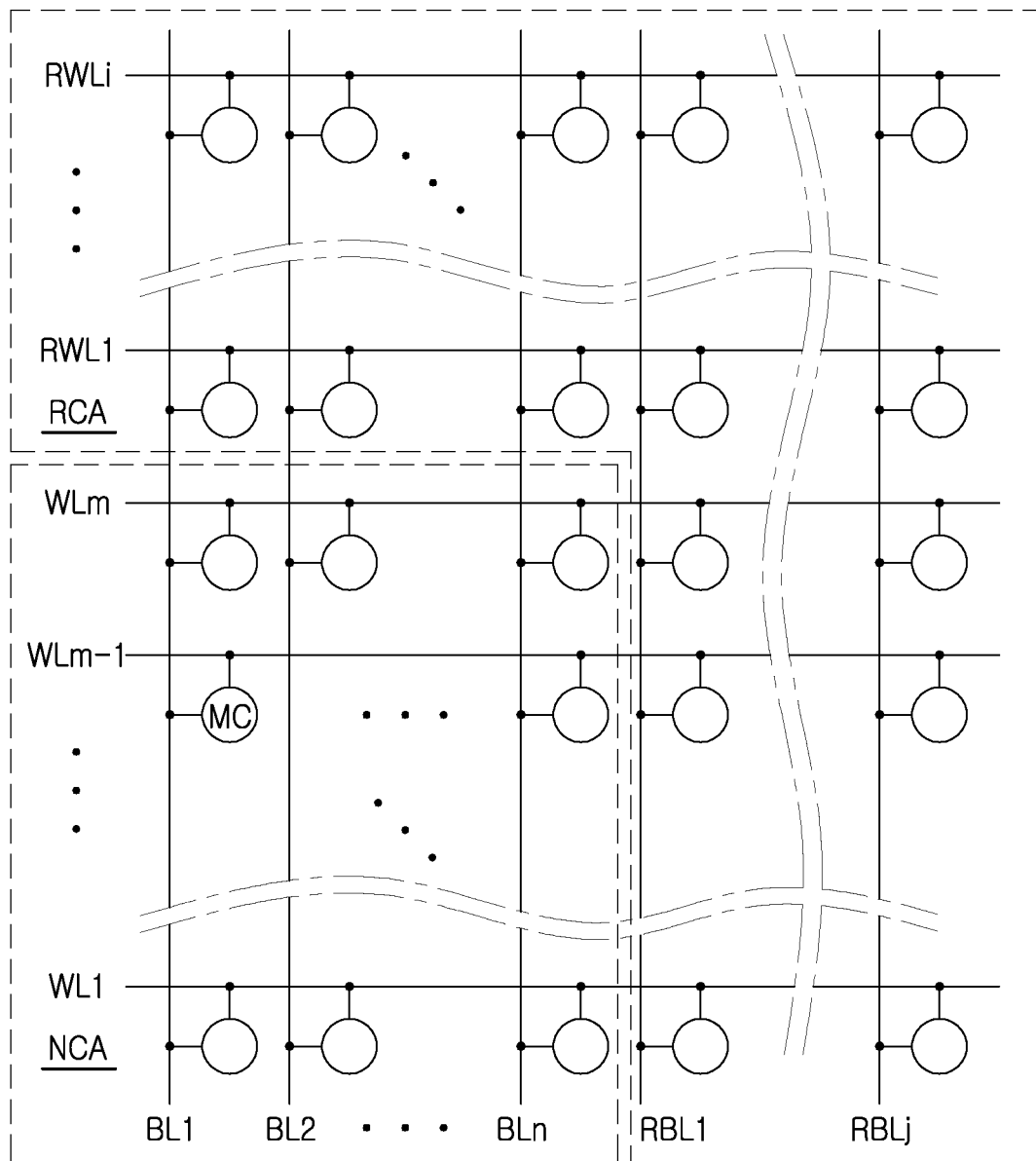
FIG. 2 is a diagram illustrating a memory cell array according to an example of the present inventive concept.

FIG. 2 is a diagram illustrating a memory cell array according to an example of the present inventive concept. Referring to FIG. 2, a memory cell array may include a normal cell array NCA and a redundancy cell array RCA. The normal cell array NCA 112 may include a plurality of memory cells disposed at an intersection point between word lines WL1 to WLm, where m is an integer of two or more, and bit lines BL1 to BLn, where n is an integer of two or more. The redundancy cell array RCA 114 may include a plurality of redundancy memory cells disposed at an intersection point between redundancy word lines RWL1 to RWLi, where "i" is an integer of two or more, and redundancy bit lines RBL1 to RBLj, where j is an integer of two or more.

The redundancy word lines RWL1 to RWLi illustrated in FIG. 2 may be disposed on the word lines WL1 to WLm, but positions of the redundancy word lines RWL1 to RWLi are not limited thereto. Thus, the redundancy word lines RWL1 to RWLi may be disposed below the word lines WL1 to WLm, may be disposed as a single group between the word lines WL1 to WLm, or may be arranged as a plurality of groups between the word lines WL1 to WLm.

The redundancy bit lines RBL1 to RBLj illustrated in FIG. 2 may be disposed on a right side of the bit lines BL1 to BLn, but positions of the redundancy bit lines RBL1 to RBLj are not limited thereto. Thus, the redundancy bit lines RBL1 to RBLj may be disposed on a left side of the bit lines BL1 to BLn, may be disposed as a single group between the bit lines BL1 to BLn, or may be arranged as a plurality of groups between the bit lines BL1 to BLn.

Figure 3:
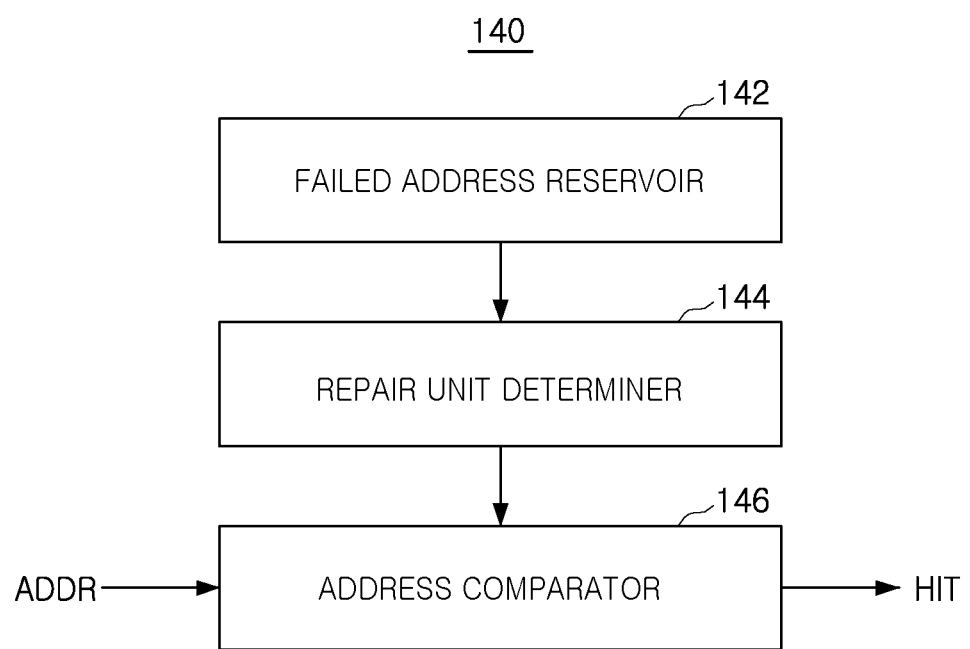
FIG. 3 is a block diagram illustrating a repair control circuit 140 according to an example of the present inventive concept.

FIG. 3 is a block diagram illustrating a repair control circuit 140 according to an example of the present inventive concept. Referring to FIG. 3, a repair control circuit 140 may include a failed address reservoir 142, a repair unit determiner 144, and an address comparator 146. The failed address reservoir 142 may be implemented to store an address detected as a failed cell in a test operation. In an example, the failed address reservoir 142 may include a non-volatile memory. The repair unit determiner 144 may store ignored address bit information corresponding to address bits ignored in the test operation, and may determine a repair unit, corresponding to a received address (ADDR), using the ignored address bit information. In this case, the repair unit may include a type of the address bits and the number of the address bits. Finally, the address comparator 146 may compare the received address (ADDR) with the address stored in the failed address reservoir 142. When the received address (ADDR) matches the stored address, the address comparator 146 may generate an address matching signal (HIT).

Figure 4:
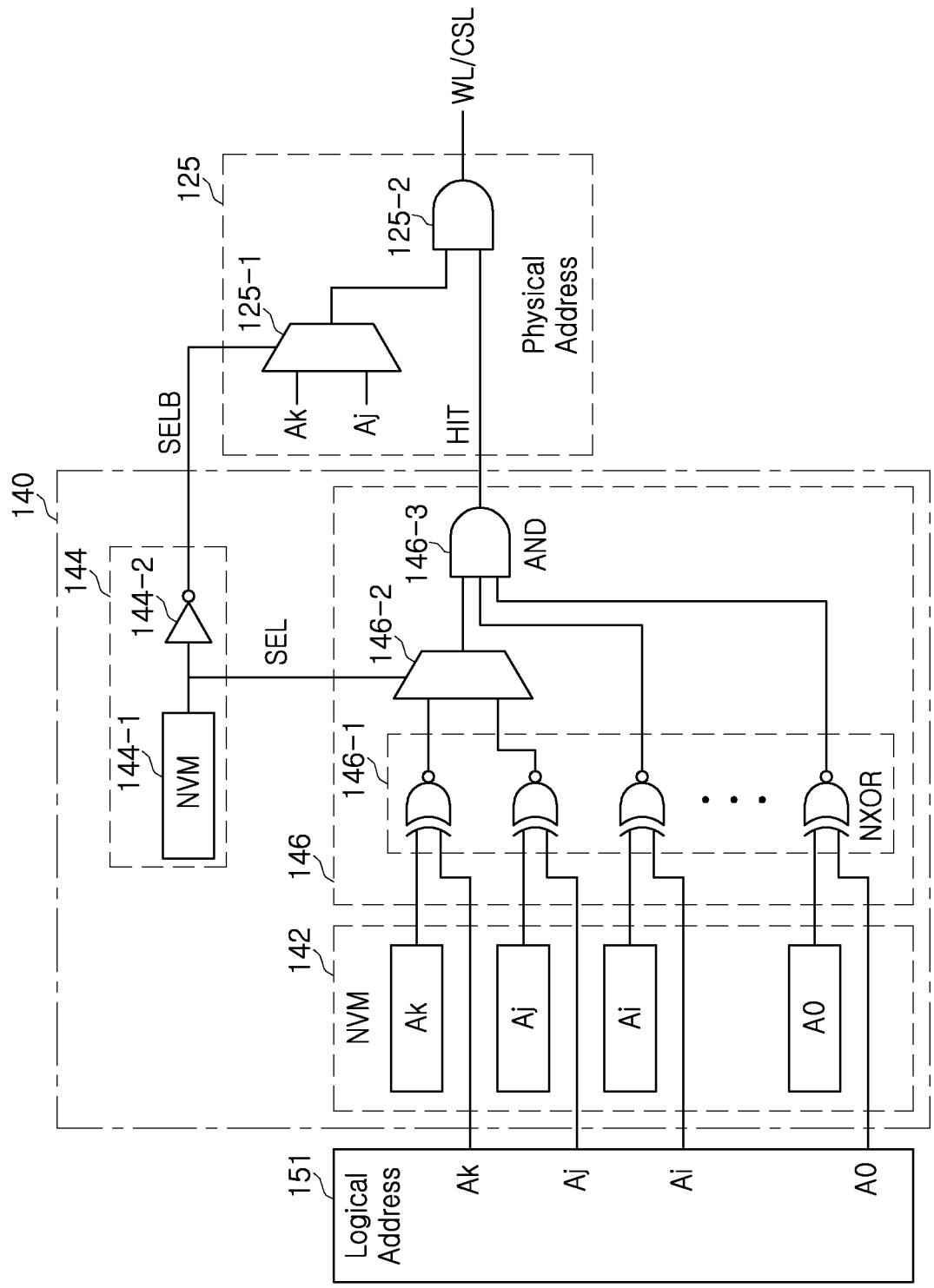
FIG. 4 is a diagram illustrating an example of a repair control circuit 140 according to an example of the present inventive concept.

FIG. 4 is a diagram illustrating an example of a repair control circuit 140 according to an example of the present inventive concept. Referring to FIG. 4, a repair control circuit 140 may include a failed address reservoir 142, a repair unit determiner 144, and an address comparator 146. The failed address reservoir 142 may store address bit values corresponding to a failed cell. For example, the failed address reservoir 142 may include a first non-volatile memory NVM storing address bits (A0, . . . , Ai, Aj, and Ak). In examples, the first non-volatile memory may include a plurality of fuses corresponding to the address bits (A0, . . . , Ai, Aj, and Ak). The repair unit determiner 144 may include a second non-volatile memory 144-1 NVM and an inverter 144-2 (e.g., a third logic circuit). The non-volatile memory 144-1 may store bit values for address bits that may be ignored among received address bits. These bit values may be used as a selection signal (SEL). The inverter 144-2 may receive output values of the non-volatile memory 144-1, and may invert the received output values, to output an inverted selection signal (SELB). The address comparator 146 may include first logic circuits 146-1, a first selector 146-2, and a second logic circuit 146-3 (e.g., AND gate).

Each of the first logic circuits 146-1 may be implemented to receive one of address bits of an address buffer 151 and one of address bits of the failed address reservoir 142 corresponding thereto, and perform an XNOR operation. In an example, the address buffer 151 may be implemented to store the address (ADDR) (see FIG. 3) received from an external device. The received address (ADDR) may store address bit values '1' or '0,' corresponding to a plurality of address bit storage units. In addition, at least two address bits (e.g., Ak and Aj) among a plurality of address bits (A0, . . . Ai, Aj, and Ak) may be used to determine a type and the number of address bits for determining a repair unit in a repair operation. The repair address bits (Aj and Ak) may be bits that may be ignored ("don't care") to determine the repair unit.

The first selector 146-2 may be implemented to output any one output value among output values of logic circuits corresponding to the address bits (Ak and Aj) in response to the selection signal (SEL). The second logic circuit 146-3 (AND) may be implemented to receive the output values of the logic circuits corresponding to the first address bits (A0, . . . Ai) and the output value of the selector 146-2, and output an address matching signal (HIT) by performing an AND operation for the received output values.

A repair line activator 125 may operate to perform the repair operation in response to the above-described address matching signal (HIT). The repair line activator 125 may include a second selector 125-1 and a third logic circuit 125-2. The second selector 125-1 may select any one of the address bits (Ak and Aj) in response to the inverted selection signal (SELB). The third logic circuit 125-2 may receive the address matching signal (HIT) and the output value of the selector 121-1, and may perform an AND operation such that a word line WL or a column select line CSL required to drive the redundancy cell may be activated.

Although the repair control circuit 140 illustrated in FIG. 4 uses the logic circuits 146-1 to perform the XNOR operation when comparing address bits, the present inventive concept is not limited thereto. For example, the repair control circuit of the present inventive concept may also implement a repair control circuit by logic circuits performing an XOR operation.

Figure 5:
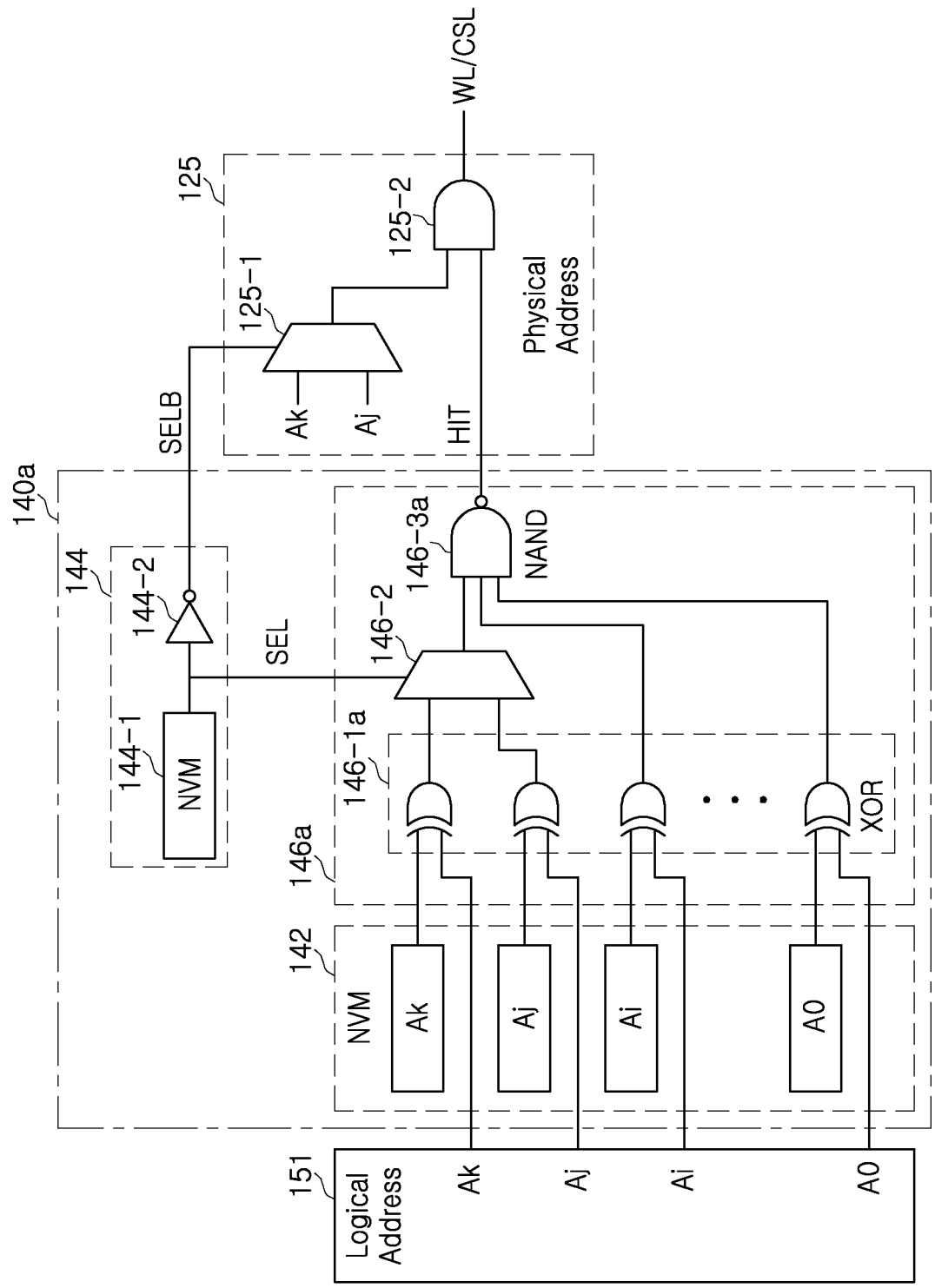
FIG. 5 is a diagram illustrating an example of a repair control circuit 140*a* according to another example of the present inventive concept.

FIG. 5 is a diagram illustrating an example of a repair control circuit 140a according to another example of the present inventive concept. Referring to FIG. 5, a repair control circuit 140a may be implemented with logic circuits 146-1a performing an XOR operation, and a logic circuit 146-3a performing an NAND operation for the output values of logic circuits, corresponding thereto, and the output values of the selector 146-2, in comparison with the "complementary" repair control circuit 140 illustrated in FIG. 4.

Figure 6:
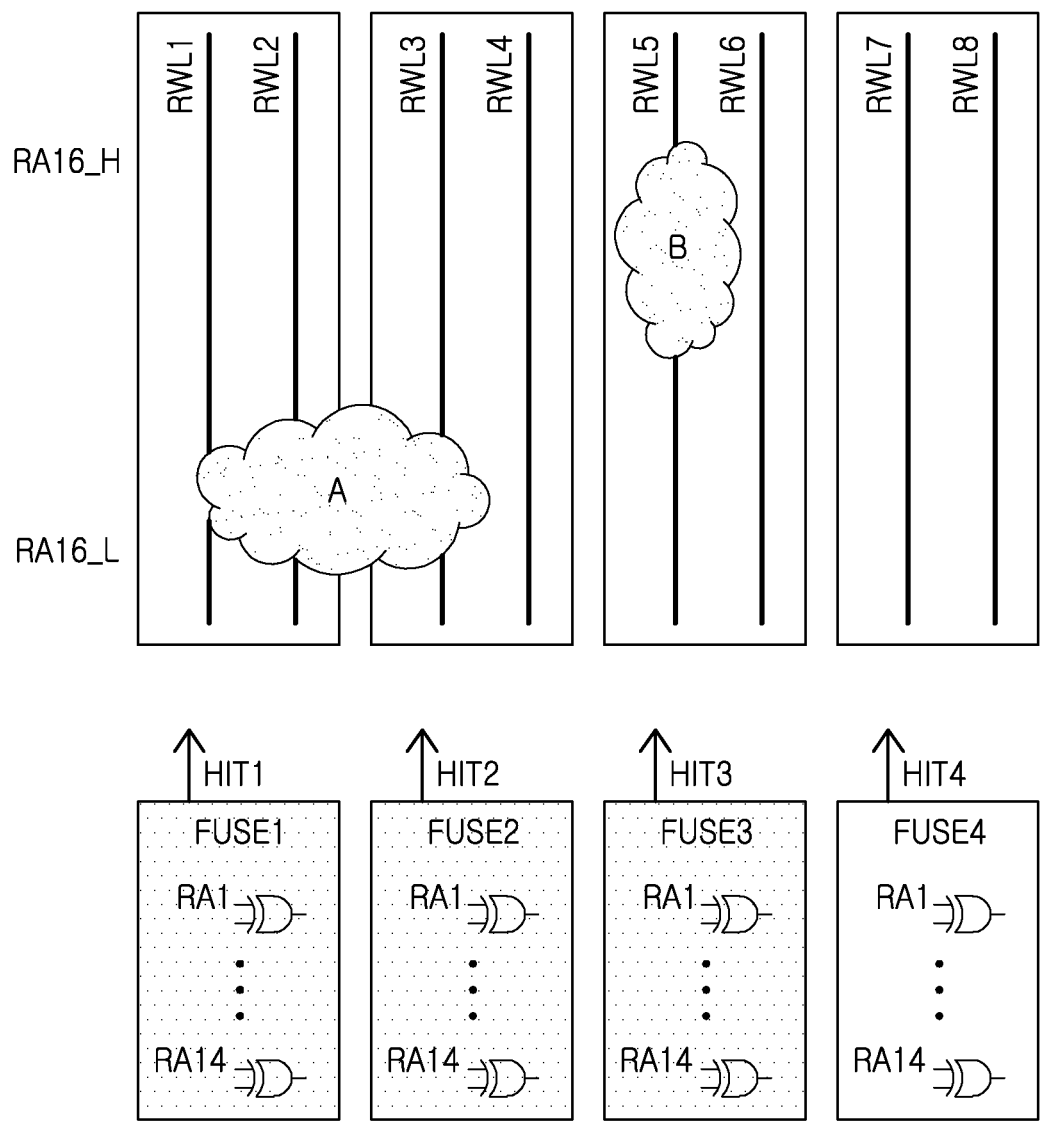
FIG. 6 is a diagram illustrating a repair operation according to a fixed repair unit.

In the following description, for convenience of explanation, it is assumed that an address is a row address (RA), the row address includes 16 address bits (RA1, ..., RA14, RA15, and RA16), and a repair control circuit includes a plurality of fuse circuits having a failed address reservoir and an address comparator. With these assumptions, FIG. 6 is a diagram illustrating a repair operation according to a fixed repair unit. Referring to FIG. 6, fuse circuits FUSE1 to FUSE4 may perform a repair operation through two redundancy word lines, respectively. As illustrated in FIG. 6, the three fuse circuits FUSE1, FUSE2, and FUSE3 may be required to repair a failed cell having a first shape A and a failed cell having a second shape B.

Figure 7:
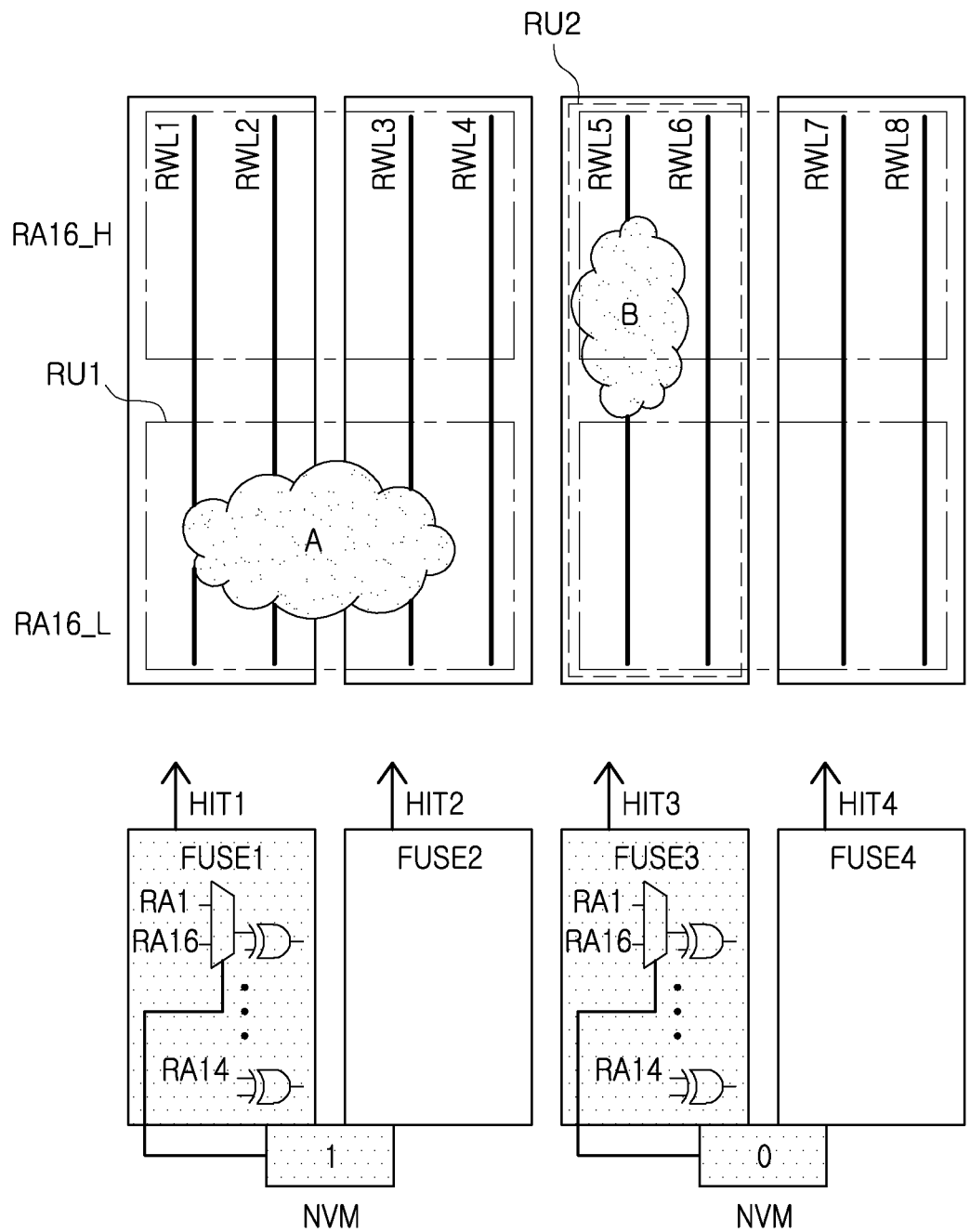
FIG. 7 is a diagram illustrating a repair operation according to a variable repair unit according to an example of the present inventive concept.

FIG. 7 is a diagram illustrating a repair operation according to a variable repair unit according to an example of the present inventive concept. Referring to FIG. 7, a repair operation of a first repair unit RU1 may be performed by a fuse circuit FUSE1, and a repair operation of a second repair unit RU2 may be performed by a fuse circuit FUSE3. In this case, the first repair unit RU1 may be a unit corresponding to four redundancy word lines RWL1 to RWL4, and the second repair unit RU2 may be a unit corresponding to two redundancy word lines RWL5 and RWL6.

Depending on shapes A and B of failed cells illustrated in FIG. 7, a repair operation may be performed by a type of address bits of RA16 and the number of two repair address bits. However, it should be understood that the repair operation of the present inventive concept is not limited to a type and number of such address bits.

The repair control circuit 140 (refer to FIG. 1) according to an example may transform a resource of a fixed redundancy unit (e.g. [2 KB, 2PXI]) into a flexible redundancy units (e.g. [2 KB, 2PXI], [1 KB, 4BXI], or the like). Thus, flexibility may be increased even with the same fuse and a redundant flag signal PRENI. That is, the repair control circuit 140 may provide transformable redundancy to the memory chip.

Existing circuits may be used by not adding a sub wordline driver SWD and a wordline enable signal PXB due to reduction in page size of a circuit. By adding a multiplex MUX of a redundancy enable signal PRENI, 1MUX/1PRENI may be needed at a comparison address for generation of a matching signal HIT. In addition, a redundancy row address RRA_168/16 may be separated, and mode register addresses MA1 and MA2 Logics may be increased. A reference fuse F-ref may be changed to a counter input as a data row address DRA. A first fuse address may be changed such that only a first row address RA0 starts with another wordline WL (+1/−1), and a second fuse address may be entered as RRA_16B/16.

In general, the smallest page unit (ex. [1K, 512M]) may be possible without adding SWD, but when a more compact page unit is implemented, a change in circuit such as SWD may be required. Column blockable failure relief as a row resource is possible. It is possible to operate other units in a single chip (addition of 1 bit/2PRENI), but it may also be set as a test mode register setting flag TMRSF for each chip in consideration of a row address RA or the like.

Figure 8:
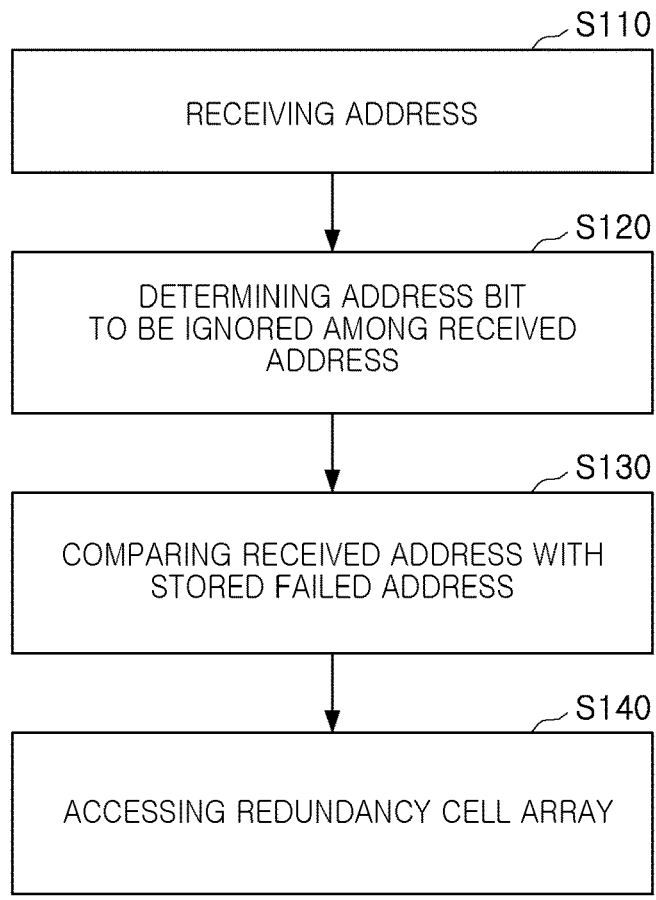
FIG. 8 is a flowchart illustrating a repair method of a memory device 100 according to an example.

FIG. 8 is a flowchart illustrating a repair method of a memory device 100 according to an example. Referring to FIGS. 1 to 8, a repair method of a memory device 100 may proceed as follows. When a read operation or a write operation is performed, a memory device 100 may receive a corresponding command and the address (ADDR) (see FIG. 3) from an external device (e.g., a memory controller) (S110). The repair unit determiner 144 (refer to FIG. 3) may determine at least one address bit to be ignored among the received addresses (ADDR) (S120). For example, as illustrated in FIG. 7, when the address (ADDR) is a row address (RA), bits of a sixteenth row address (RA)16 may be ignored by a fuse circuit FUSE1 and the repair unit determiner 144 (see FIG. 4). The address controller 140 (refer to FIG. 3) may compare the received address (ADDR) with an address stored in the failed address reservoir 142 (refer to FIG. 3) (S130). As an address comparison result, an address matching signal (HIT) may be generated. Thereafter, redundancy word lines or redundancy column selection lines, corresponding to the physical address associated with the received address (ADDR) in response to the address matching signal (HIT), may be activated. Thereafter, a read operation may be performed from memory cells connected to the activated redundancy word lines or the activated redundancy column selection lines, or a write operation may be performed on the memory cells connected to the activated redundancy word lines or the activated redundancy column selection lines.

Figure 9:
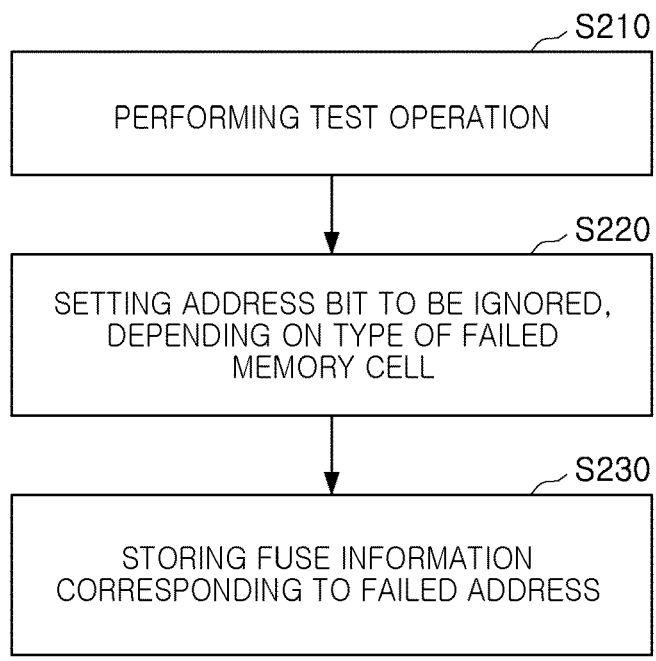
FIG. 9 is a flowchart illustrating a process of repairing a memory device in a test operation according to an example of the present inventive concept.

FIG. 9 is a flowchart illustrating a process of repairing a memory device in a test operation according to an example of the present inventive concept. Referring to FIGS. 1 to 9, a repair process in a test operation of a memory device 100 may proceed as follows. A test operation may be performed in a memory device 100 at a wafer level (S210). A repair process may be performed according to failure of a memory cell. Depending on a type of a failed memory cell, address bits to be ignored may be set by a fuse cutting operation (S220). For example, bit values corresponding to address bits to be ignored may be stored in the non-volatile memory 144-1 illustrated in FIG. 4. Thereafter, fuse information corresponding to a failed address may be stored by the fuse cutting operation (S230).

Figure 10:
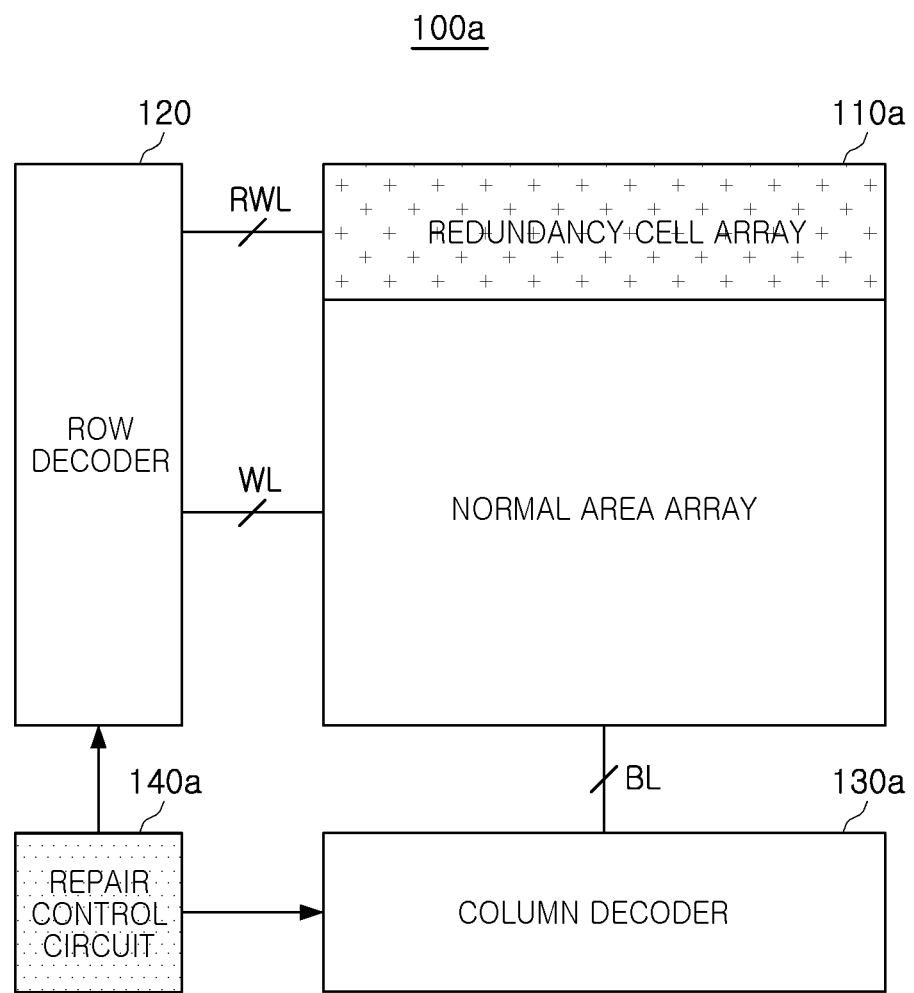
FIG. 10 is a diagram illustrating a memory device 100*a* according to another example of the present inventive concept.
Figure 11:
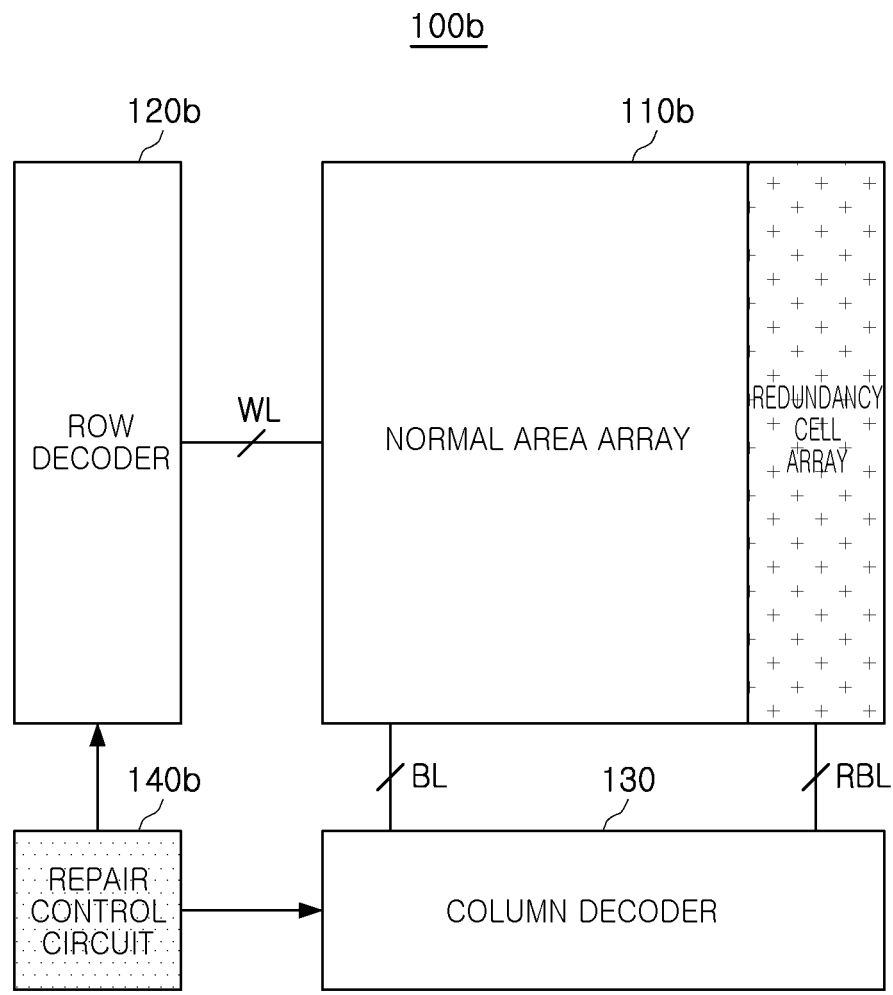
FIG. 11 is a diagram illustrating a memory device 100*b* according to another example of the present inventive concept.

Although, in FIG. 1, both the row address and the column address have redundancy areas, the present inventive concept is not limited thereto. For example, FIG. 10 is a diagram illustrating a memory device 100a according to another example of the present inventive concept. Referring to FIG. 10, a memory device 100a may include a memory cell array 100a having a redundancy cell array corresponding to a row address, and a repair control circuit 140a performing a repair operation corresponding to a redundancy row address, compared to the memory device 100 illustrated in FIG. 1. In contrast, FIG. 11 is a diagram illustrating a memory device 100b according to another example of the present inventive concept. Referring to FIG. 11, a memory device 100b may include a memory cell array 100b having a redundancy cell array corresponding to a column address, and a repair control circuit 140b performing a repair operation corresponding to a redundancy column address, compared to the memory device 100 illustrated in FIG. 1.

Figure 12:
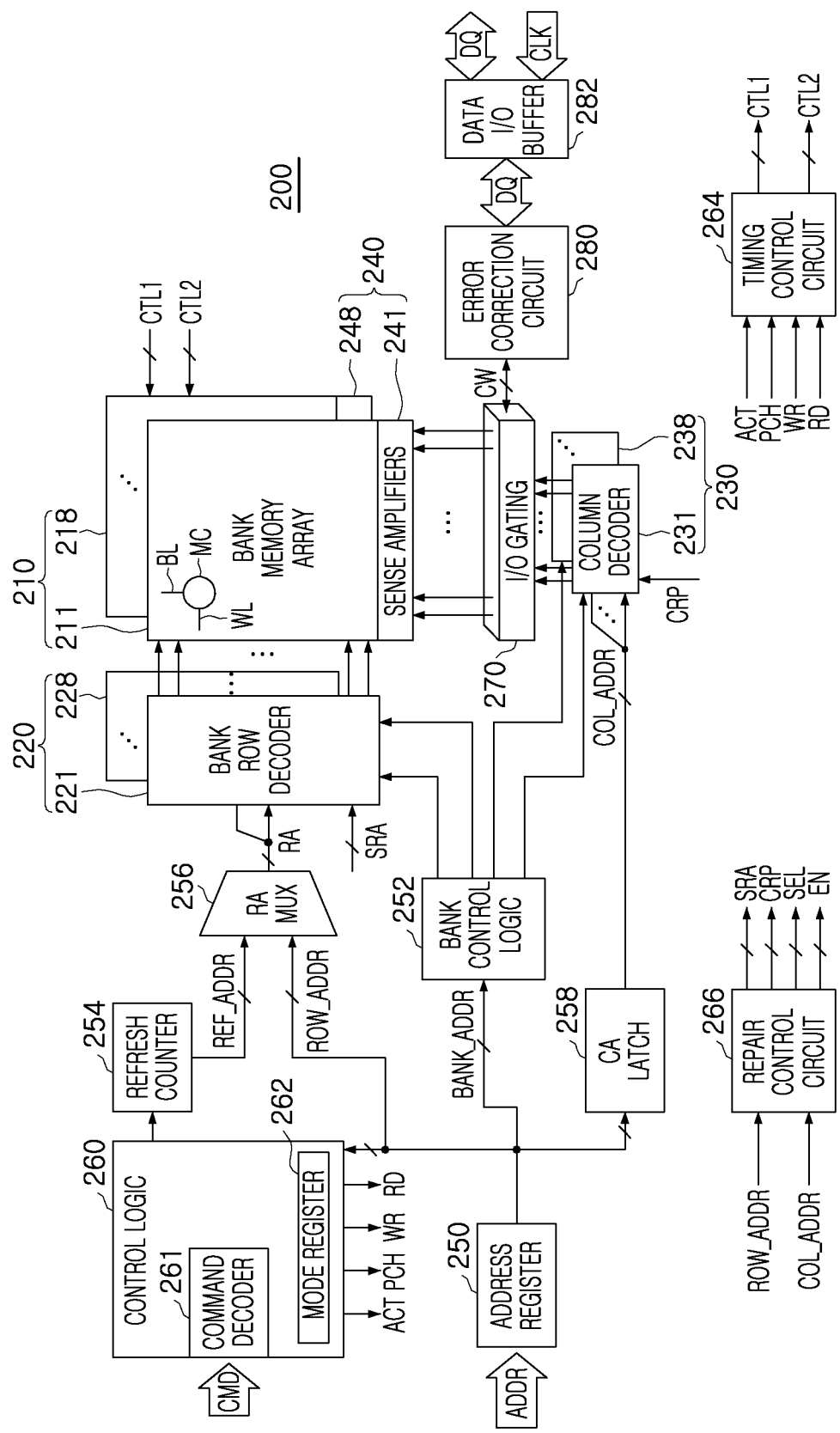
FIG. 12 is a diagram illustrating a memory device according to another example of the present inventive concept.

FIG. 12 is a diagram illustrating a memory device according to another example of the present inventive concept. Referring to FIG. 12, a memory device 200 may include a memory cell array 210, a row decoder 220, a column decoder 230, a sense amplifier circuit 240, an address register 250, a bank control logic 252, a refresh counter 254, a row address multiplexer 256, a column address latch 258, a control logic 260, a repair control circuit 266, a timing control circuit 264, an input/output gating circuit 270, an error correction circuit 280, and a data input/output buffer 282.

The memory cell array 210 may include first to eighth bank arrays 211 to 218, however, the number of bank arrays constituting the memory cell array 210 is not limited thereto. The row decoder 220 may include first to eighth bank row decoders 221 to 228 connected to the first to eighth bank arrays 211 to 218, respectively. The column decoder 230 may include first to eighth bank column decoders 231 to 238 connected to the first to eighth bank arrays 211 to 218, respectively. The sense amplifier circuit 240 may include first to eighth bank sense amplifiers 241 to 248 connected to the first to eighth bank arrays 211 to 218, respectively.

The first to eighth bank arrays 211 to 218, the first to eighth bank row decoders 221 to 228, the first to eighth bank column decoders 231 to 238, and the first to eighth bank array decoders The eight bank sense amplifiers 241 to 248 may configure first to eighth banks, respectively. Each of the first to eighth bank arrays 211 to 218 may include a plurality of memory cells MC formed at intersection points between the word lines WL and bit lines BL.

In an embodiment of the inventive concepts, each of the first to eighth bank arrays 211 to 218 may include the normal area 112 and the redundancy area 114 of the memory cell array 110 illustrated in FIG. 1. The address register 250 may receive and store an address (ADDR) having a bank address (BANK_ADDR), a row address (ROW_ADDR), and a column address (COL_ADDR) from an external memory controller. The address register 250 may provide a received bank address (BANK_ADDR) to the bank control logic 252, may provide a received row address (ROW_ADDR) to the row address multiplexer 256, and may provide a received column address (COL_ADDR) to the column address latch 258.

The bank control logic 252 may generate bank control signals in response to the bank address (BANK_ADDR). A bank row decoder, corresponding to the bank address (BANK_ADDR) among the first to eighth bank row decoders 221 to 228 in response to the bank control signals, may be activated. A bank column decoder, corresponding to the bank address (BANK_ADDR) among the first to eighth bank column decoders 231 to 238 in response to the bank control signals, may be activated.

The row address multiplexer 256 may receive the row address (ROW_ADDR) from the address register 250, and may receive a refresh row address (REF_ADDR) from the refresh counter 254. The row address multiplexer 256 may selectively output the row address (ROW_ADDR) or the refresh row address (REF_ADDR) as a row address (RA). The row address (RA) output from the row address multiplexer 256 may be applied to the first to eighth bank row decoders 221 to 228, respectively.

Among the first to eighth bank row decoders 221 to 228, a bank row decoder activated by the bank control logic 252 may decode the row address (RA) output from the row address multiplexer 256, to activate word lines corresponding to the row address. For example, the activated bank row decoder may apply a word line driving voltage to a word line corresponding to the row address. The activated bank row decoder may also activate a word line corresponding to the row address, and may, at the same time, activate a redundancy word line corresponding to a spare row address (SRA) (a/k/a a 'redundancy row address') output from the repair control circuit 266.

The column address latch 258 may receive the column address (COL_ADDR) from the address register 250, and may temporarily store the received column address (COL_ADDR). In addition, the column address latch 258 may gradually increase the received column address (COL_ADDR) in a burst mode. The column address latch 258 may apply the temporarily stored or gradually increased column address (COL_ADDR) to the first to eighth bank column decoders 231 to 238, respectively.

A bank column decoder activated by the bank control logic 252 among the first to eighth bank column decoders 231 to 238 may activate a sense amplifier corresponding to the bank address (BANK_ADDR) and the column address (COL_ADDR) by the input/output gating circuit 270. In addition, the activated bank column decoder may perform a column repair operation in response to a column repair signal (CRP) output from the repair control circuit 266.

Input/output gating circuits in the input/output gating circuit 270 may include input data mask logic, read data latches for storing data output from the first to eighth bank arrays 211 to 228, and write drivers for writing the data to the first to eighth bank arrays 211 to 218, together with circuits for gating the input/output data.

A codeword (CW) to be read from one bank array among the first to eighth bank arrays 211 to 218 may be sensed by a sense amplifier corresponding to the one bank array, and may be stored in read data latches. The codeword (CW) stored in the read data latches may be provided to the memory controller by the data input/output buffer 282, after an ECC decoding operation is performed by the error correction circuit 280. Data (DQ) to be written to the one bank array among the first to eighth bank arrays 210 to 218 may be written to the one bank array by write drivers, after an ECC encoding operation is performed by the error correction circuit 280.

The data input/output buffer 282 may provide the data (DQ) to the error correction circuit 280, based on a clock signal (CLK) provided from the memory controller in the write operation, and may provide the data (DQ) provided from the error correction circuit 280 to the memory controller in the read operation.

The error correction circuit 280 may generate parity bits, based on the data bits of the data (DQ) provided from the data input/output buffer 282 in the write operation, and may provide the codeword (CW) including the data (DQ) and the parity bits to the input/output gating circuit 270, and the input/output gating circuit 270 may write the codeword (CW) to the bank array.

In addition, the error correction circuit 280 may receive the codeword (CW) read in the one bank array from the input/output gating circuit 270 in the read operation. The error correction circuit 280 may perform the ECC decoding operation for the data (DQ) by using the parity bits included in the read codeword (CW), to correct at least one error bit included in the data (DQ), to provide the corrected bit in the data input/output buffer 282.

The control logic circuit 260 may be implemented to control the operation of the memory device 200. For example, the control logic circuit 260 may generate control signals such that the semiconductor memory device 200 performs a write operation or a read operation. The control logic circuit 260 may include a command decoder 261 for decoding a command CMD received from the memory controller, and a mode register 262 for setting an operation mode of the memory device 200.

For example, the command decoder 261 may decode a write enable signal (/WE), a row address strobe signal (/RAS), a column address strobe signal (/CAS), a chip select signal (/CS), and the like, to generate operation control signals (ACT, PCH, WE, and RD), corresponding to a command CMD. The control logic circuit 260 may provide operation control signals (ACT, PCH, WE, and RD) to the timing control circuit 264. The control signals (ACT, PCH, WR, and RD) may include an active signal (ACT), a precharge signal (PCH), a write signal (WR), and a read signal (RD). The timing control circuit 264 may generate first control signals (CTL1) controlling a voltage level of a word line WL and second control signals (CTL2) controlling a voltage level of a bit line BL, in response to the operation control signals (ACT, PCH, WR, and RD), and may provide the first control signals (CTL1) and the second control signals (CTL2) to the memory cell array 210.

The repair control circuit 266 may generate repair control signals (CRP, SEL, EN, and SRA) controlling repair operations of a first cell area and a second cell area in at least one bank array, based on fuse information of each of the row address (ROW_ADDR), the column address (COL_ADDR), and word lines of an address (ADDR) (or an access address). The repair control circuit 266 may provide a spare row address (SRA) (or a redundancy row address) to a corresponding bank row decoder, may provide a column repair signal (CRP) to a corresponding bank column decoder, and may provide a selection signal (SEL) and the enable signal (SRA) to a block control circuit associated with a corresponding spare array block (or a redundancy array block).

The repair control circuit 266 may change a repair unit, based on the address (ADDR) and the fuse information. For example, the repair control circuit 266 may change a type and the number of repair address bits, based on the address (ADDR) and the fuse information.

A memory device according to an example of the present inventive concept may store mapping information of a logical address and a physical address having a plurality of bits in a non-volatile memory NVM, and may change a type and the number of address bits corresponding to one piece of the mapping information. According to an example, when all addresses consisting of a plurality of bits match each other (when a mapping condition is established), a type and the number of the plurality of address bits for generating such a condition may vary. In another example, a type and the number of the plurality of address bits may be determined in the test operation, and may be stored in the NVM.

A memory device according to an example of the present inventive concept may include a plurality of redundancy cells, may store repair mapping information of the redundancy cells in a separate non-volatile memory NVM, and may repair a normal cell of specific range to a redundancy cell of the same range due to one repair mapping information. In this case, the range of the cell area corresponding to the repair mapping information may be changed.

In an example, in a test operation of storing repair mapping information, a repair unit may be independently set for all mappings. The repair unit set in this case may be stored in each non-volatile memory NVM. Alternatively, in a test operation of storing repair mapping information, a repair unit may be set to all mappings in common. In this case, the set repair unit may be stored in a single non-volatile memory NVM.

Figure 13:
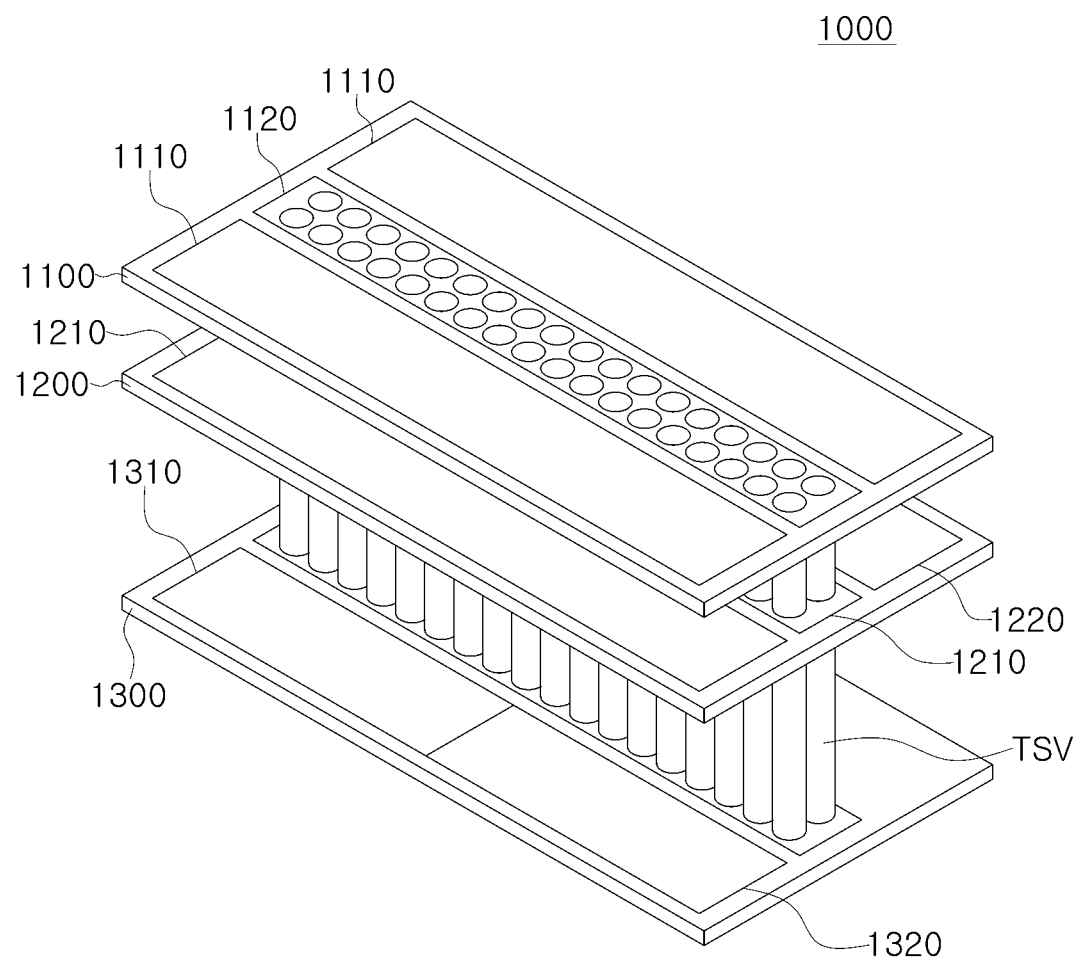
FIG. 13 is a block diagram illustrating a memory chip according to an example of the disclosure.

A memory chip of the present inventive concept may be implemented as a stack type memory chip. For example, FIG. 13 is a block diagram illustrating a memory chip according to an example of the present inventive concept. Referring to FIG. 13, a memory chip 1000 may include first to third memory dies 1100 to 1300 and through silicon vias (TSVs) stacked in a vertical direction on a substrate. In this case, the number of stacked memory dies will not be limited to that illustrated in FIG. 13. For example, first and second memory dies 1100 and 1200 may be slave dies, and a third memory die 1300 may be a master die or a buffer die.

The first memory die 1100 may include a first memory cell array 1110, and a first through electrode area 1120 for access to the first memory cell array 1110. The second memory die 1200 may include a second memory cell array 1210, and a second through electrode area 1220 for access to the second memory cell array 1210. In this case, the first through electrode area 1120 may represent an area in which through electrodes for communication between the first memory die 1100 and the third memory die 1300 are disposed in the first memory die 1100. Similarly, the second through electrode area 1220 may represent an area in which through electrodes for communication between the second memory die 1200 and the third memory die 1300 are disposed in the second memory die 1200. The through electrodes may provide electrical paths between the first through third memory dies 1100 to 1300.

The first to third memory dies 1100 to 1300 may be electrically connected to each other by the through electrodes. For example, the number of through electrodes may be hundreds to thousands, and the through electrodes may be arranged in a matrix arrangement. The third memory die 1300 may include a first peripheral circuit 1310 and a second peripheral circuit 1320. In this case, the first peripheral circuit 1310 may include circuits for access to the first memory die 1100, and the second peripheral circuit 1320 may include circuits for access to the second memory die 1200. In an example, each of the peripheral circuits 1310 and 1320 may be implemented by a method and a device for performing the repair operation described with reference to FIGS. 1 to 13.

Figure 14:
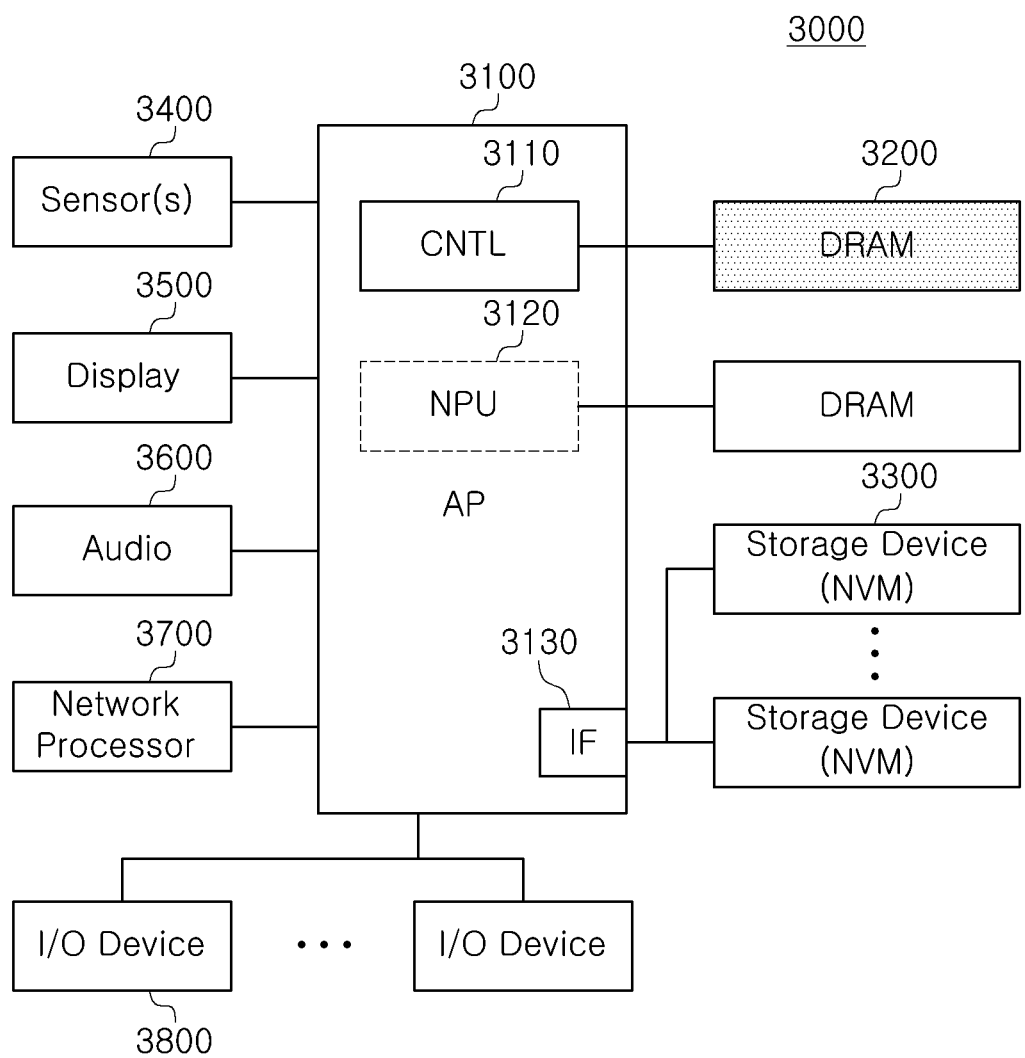
FIG. 14 is a diagram illustrating a mobile device 3000 according to an example.

According to further embodiments of the inventive concepts, the present inventive concept may be applied to a mobile device. For example, FIG. 14 is a diagram illustrating a mobile device 3000 that may embody inventive concepts. Referring to FIG. 14, the mobile device 3000 may include an application processor 3100, at least one DRAM 3200, at least one storage device 3300, at least one sensor 3400, a display device 3500, an audio device 3600, a network processor 3700, and at least one input/output device 3800. For example, the mobile device 3000 may be implemented as a laptop computer, a mobile phone, a smartphone, a tablet personal computer, or a wearable computer.

The application processor 3100 may be implemented to control an overall operation of the mobile device 3000. The application processor 3100 may execute applications that provide an internet browser, a game, a video, and the like. In an example, the application processor 3100 may include a single core or a multi-core. For example, the application processor 3100 may include a multi-core such as a dual-core, a quad-core, a hexa-core, or the like. In an example, the application processor 3100 may further include a cache memory located internally or externally.

The application processor 3100 may include a controller 3110, a neural processing unit (NPU) 3120, and an interface 3130. In an example, the NPU 3120 may optionally be provided. In an example, the application processor 3100 may be implemented as a system-on-chip (SoC). A kernel of an operating system running in the system-on-chip (SoC) may include an input/output (I/O) scheduler, and a device driver controlling the storage device 3300. The device driver may control access performance of the storage device 3300 with reference to the number of sync queues managed by the input/output scheduler, or may control a CPU mode, a DVFS level, or the like in the SoC.

The DRAM 3200 may be connected to the controller 3110. The DRAM 3200 may store data required for an operation of the application processor 3100. For example, the DRAM 3200 may temporarily store an operating system (OS) and application data, or may be used as an execution space of various software codes.

The DRAM 3200 may perform an on-die mirroring operation according to a request of the application processor 3100 or a user's selection. A DRAM 3200 may be connected to the NPU 3120. The DRAM 3200 may store data related to artificial intelligence (AI) calculation.

DRAM 3200 may have relatively faster latency and BW than the I/O device or the flash memory. The DRAM 3200 may be initialized at mobile power-on, may be used as a temporary storage location of OS and application data by loading the OS and application data, or may be used as an execution space of various software codes. The mobile system performs a multitasking operation of simultaneously loading several applications, and switching between applications and execution speed may be used as a performance index of the mobile system.

The storage device 3300 may be connected to the interface 3130. In an example, the interface 3130 may be operated by any one communication protocol among DDR, DDR2, DDR3, DDR4, a low power DDR (LPDDR), a universal serial bus (USB), a multimedia card (MMC), an embedded MMC, a peripheral component interconnection (PCI), a non-volatile memory express (NVMe), a peripheral component interconnect express (PCIe), a serial at attachment (SATA), a small computer system interface (SCSI), a serial attached SCSI (SAS), an universal storage bus (USB) attached SCSI (UAS), an internet small computer system interface (iSCSI), a fiber channel, and a fiber channel over ethernet (FCoE). In an example, any one storage device 3300 may be included in the mobile device 3000 in an embedded form. In another example, any one storage device 3300 may be included in the mobile device 3000 in a detachable manner.

The storage device 3300 may be implemented to store user data. For example, the storage device 3300 may store data collected from the sensor 3400, or may store data network data, augmented reality (AR)/virtual reality (VR) data, or high definition (HD) 4K contents. The storage device 3300 may include at least one non-volatile memory device. For example, the storage device 3300 may include a solid state driver (SSD), an embedded multimedia card (eMMC), or the like.

In an example, the storage device 3300 may be implemented as a separate chip in the application processor 3100, or may be implemented as a single package with the application processor 3100. In another example, the storage device 3300 may be mounted using various types of packages. For example, the storage device 3300 may be mounted using packages, such as Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP) or the like.

The sensor 3400 may be implemented to sense an external environment of the mobile device 3000. In an example, the sensor 3400 may include an image sensor that senses an image. In this case, the sensor 3400 may transmit generated image information to the application processor 3100. In another example, the sensor 3400 may include a biosensor sensing biometric information. For example, the sensor 3400 may sense a fingerprint, an iris pattern, a blood vessel pattern, a heart rate, a blood sugar level, and the like, and may generate sensing data corresponding to the sensed information. On the other hand, the sensor 3400 is not limited to the image sensor and the biosensor. For example, the sensor 3400 may include other types of sensors such as an illuminance sensor, an acoustic sensor, an acceleration sensor, or the like.

The display device 3500 may be implemented to output data. For example, the display device 3500 may output image data sensed using the sensor 3400 or output data calculated using the application processor 3100.

The audio device 3600 may be implemented to externally output voice data or sense external voices. The network processor 3700 may be implemented to communicate with an external device by a wired or wireless communication method. The input/output device 3800 may be implemented to input data to or output data from the mobile device 3000. The input/output device 3800 may include devices that provide digital input and output functions such as a USB, a storage, a digital camera, a SD card, a touch screen, a DVD, a modem, and a network adapter.

Figure 15:
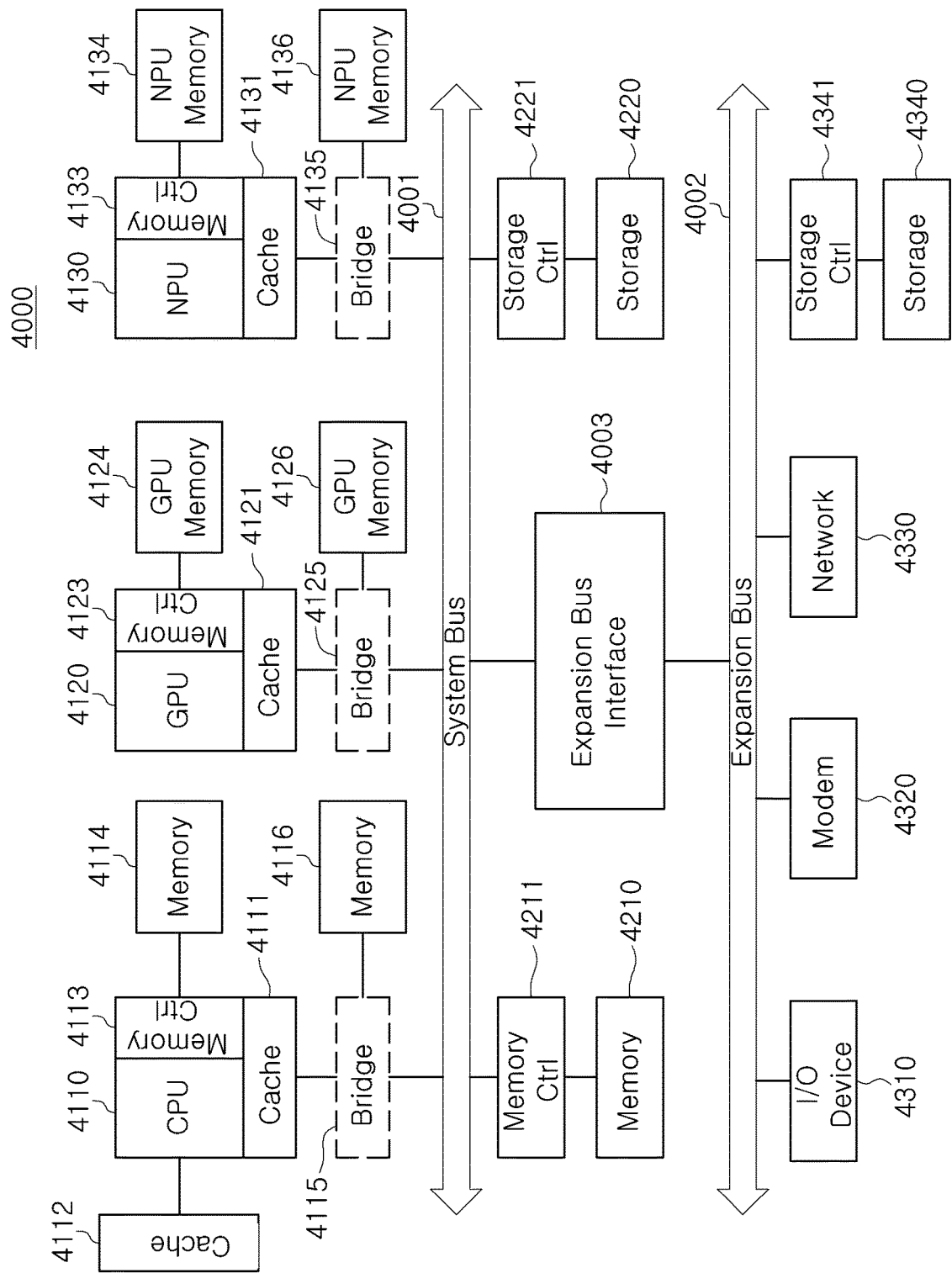
FIG. 15 is a diagram illustrating a computing system 4000 according to an example.

Embodiments of the present inventive concept may also be applied to various kinds of computing systems, for example, CPU/GPU/NPU platforms. For example, FIG. 15 is a diagram illustrating a computing system 4000 according to an example of the present inventive concept. Referring to FIG. 15, the computing system 4000 may include a Central Processing Unit (CPU) 4110, a Graphics Processing Unit (GPU) 4120, or a Neural Processing Unit (NPU) 4130 (or an application-specific processing unit), connected to a system bus 4001; a memory device 4210 or a storage device 4220 connected to the system bus 4001; and an input/output device 4310, a modem 4320, a network device 4330, or a storage device 4340, connected to an expansion bus 4002. In this case, the expansion bus 4002 may be connected to the system bus 4001 through an expansion bus interface 4003.

In an example, the CPU 4110, the GPU 4120, and the NPU 4130 may include on-chip caches 4111, 4121, and 4131, respectively. In another example, the CPU 4110 may include an off-chip cache 4112. Although not illustrated in FIG. 15, each of the GPU 4120 and the NPU 4130 may also include an off-chip cache. In an example, the off chip cache 4112 may be internally connected to the CPU 4110, the GPU 4120, and the NPU 4130 through different buses.

In an example, the on-chip/off-chip cache may include a volatile memory such as a dynamic random access memory (DRAM), a static random access memory (SRAM), or the like, or a non-volatile memory such as a NAND flash memory, a phase random access memory (PRAM), a resistive random access (RRAM), or the like.

In an example, main memories 4114, 4124, and 4134 may be connected to the CPU 4110, the GPU 4120, and the NPU 4130 through corresponding memory controllers 4113, 4123, and 4133. In an example, memories 4116, 4126, and 4136 may be connected to the CPU 4110, the GPU 4120, and the NPU 4130 through bridges 4115, 4125, and 4135. The bridges 4115, 4125, and 4135 may include memory controllers that control the corresponding memories 4116, 4126, and 4136. In an example, the bridges 4115, 4125, and 4135 may be respectively implemented as a network device, a wireless network device, a switch, a bus, a cloud, or an optical channel.

In an example, the memories 4124 and 4126 may include a GPU memory. The GPU memory may hold instructions and data that may interact with the GPU. Commands and data may be copied from a main memory or a storage. The GPU memory may store image data, and may have greater bandwidth than a memory. The GPU memory may separate a clock from the CPU. The GPU may read and process image data in GPU memory, and may then write in the GPU memory. The GPU memory may be configured to accelerate graphics processing.

In an example, the memories 4134 and 4136 may include an NPU memory. The NPU memory may hold instructions and data that may interact with the NPU. Commands and data may be copied from a main memory or a storage. The NPU memory may maintain weight data for neural networks. The NPU memory may have greater bandwidth than a memory. The NPU memory may separate a clock from the CPU. The NPU may read and update weighted data in the NPU memory, and then write in the NPU memory during training. The NPU memory may be configured to accelerate machine learning, such as neural network training and inference.

In some examples, each of the main memories 4114, 4116, 4124, 4126, 4134, 4136, and 4210 may be implemented as a memory chip performing the repair operation described with reference to FIGS. 1 to 13.

In an example, the main memory may include a volatile memory such as a DRAM, an SRAM or the like, or a non-volatile memory such as a NAND flash memory, a PRAM, a RRAM or the like. The main memory has lower latency and lower capacity than those of secondary storages 4210 and 4220.

The CPU 4110, the GPU 4120, or the NPU 4130 may access the secondary storages 4210 and 4220 through the system bus 4001. The memory device 4210 may be controlled by a memory controller 4211, which is connected to the system bus 4001. The storage device 4220 may be controlled by a storage controller 4221. The storage controller 4221 may be connected to the system bus 4001.

The storage device 4220 may be implemented to store data. The storage controller 4221 may be implemented to read data from the storage device 4220 and transmit the reading data to a host. The storage controller 4221 may be implemented to store the transmitted data in the storage device 4220 in response to a request from the host. Each of the storage device 4220 and the storage controller 4221 may include a buffer that stores metadata, reads a cache for storing frequently-accessed data, or stores a cache for increasing a writing efficiency. For example, a write cache may receive and process a specific number of write requests. And, the storage device 4220 may include a volatile memory such as a hard disk drive (HDD), and a non-volatile memory such as an NVRAM, an SSD, an SCM, or a new memory.

Figure 16:
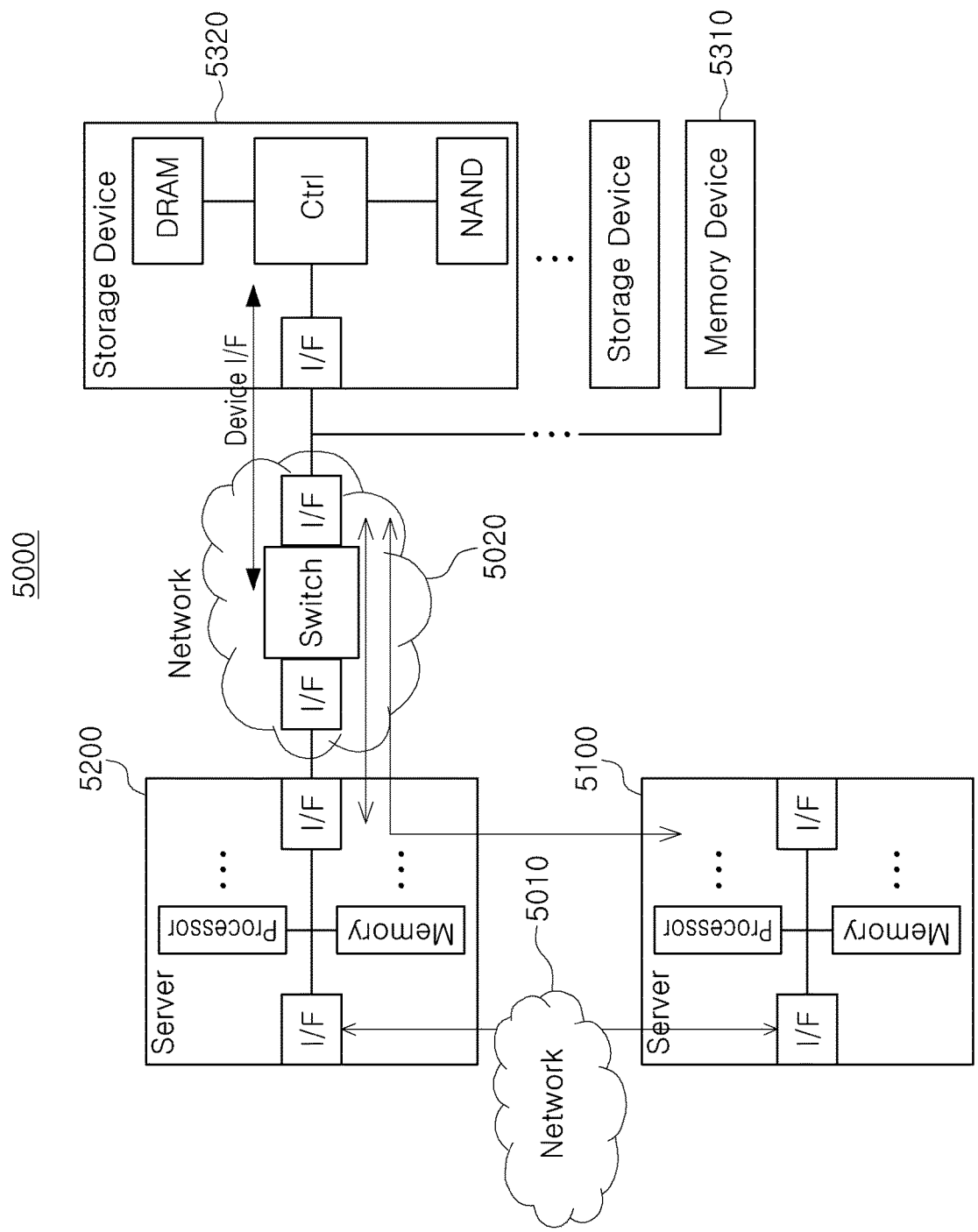
FIG. 16 is a diagram illustrating a data server system 5000 according to an example of the present inventive concept.

An example of the present inventive concept may be applied to a data server system. For example, FIG. 16 is a diagram illustrating a data server system 5000 according to an example of the present inventive concept. Referring to FIG. 16, the data server system 5000 may include a first server 5100 (an application server), a second server 5200 (a storage server), a memory device 5310, and at least one storage device 5320.

Each of the first server 5100 and the second server 5200 may include at least one processor and memory. In an example, each of the first server 5100 and the second server 5200 may be implemented as a memory-processor pair. In another example, each of the first server 5100 and the second server 5200 may be implemented with a different number of processors and memories suitably for use.

In an example, the first server 5100 and the second server 5200 may perform communications through a first network 5010. In an example, each of the first server 5100 and the second server 5200 may access the memory device 5310 through the first network 5010 and/or a second network 5020. In an example, each of the first server 5100 and the second server 5200 may directly or indirectly access the storage device 5320 through the first network 5010 and the second network 5020.

In an example, an interface I/F of the storage device 5320 may include SATA, SAS, PCIe, DIMM, HBM, HMC, or NVDIMM. In an example, the second network 5020 may be a connection type of a direct attached storage (DAS), a network attached storage (NAS), and a storage area network (SAN) scheme.

In an example, the memory device 5310 and the storage device 5320 may respectively transmit device information to the server 5200 by a command or by itself. In an example, the memory device 5310 may be implemented as a memory chip performing the repair operation described with reference to FIGS. 1 to 13. The data server system 5000 may perform big data AI calculation. In this case, the big data may include audio, photo, video, or weight/training data.

In a memory device and a repair method thereof according to an example of the present inventive concept, a repair unit is variable by setting a bit type or the number of an address differently according to a failed address.

While examples have been illustrated and described above, it will be apparent to those skilled in the art that modifications and variations could be made without departing from the scope of the present inventive concept as defined by the appended claims.

What is claimed is:

1. A memory device, comprising:
   a first bank including first wordlines;
   a second bank including second wordlines;
   a third bank including third wordlines;
   a first fuse circuit configured to receive a first row address indicating a wordline among the first wordlines and the second wordlines, and perform a first repair operation with a first repair unit when the first row address matches stored failed addresses;
   a second fuse circuit configured to receive a second row address indicating a wordline among the third wordlines, and perform a second repair operation with a second repair unit when the second row address matches the stored failed addresses; and wherein the first repair unit is a 2n-wordline pair unit and the second repair unit is a 2-wordline pair unit, where "n" is a positive integer greater than one.

2. The memory device of claim 1, further comprising:
a first redundant bank including first redundant wordlines;
a second redundant bank including second redundant wordlines;
wherein the first fuse circuit activates corresponding wordlines of the first repair unit among the first redundant wordlines with the first repair operation; and
wherein the second fuse circuit activates corresponding wordlines of the second repair unit among the second redundant wordlines with the second repair operation.

3. A memory device, comprising:
a first bank including first wordlines;
a second bank including second wordlines;
a third bank including third wordlines;
a first fuse circuit configured to receive a first row address indicating a wordline among the first wordlines and the second wordlines, and perform a first repair operation with a first repair unit when the first row address matches stored failed addresses;
a second fuse circuit configured to receive a second row address indicating a wordline among the third wordlines, and perform a second repair operation with a second repair unit when the second row address matches the stored failed addresses, said second repair unit being different than the first repair unit; and
wherein each of the first fuse circuit and the second fuse circuit includes:
a first non-volatile memory configured to store a plurality of bits of a failed address;
a plurality of first logic circuits, respectively configured to compare one bit of the received row address with a corresponding bit of the failed address stored in the first non-volatile memory;
a first selector configured to output a selected one of two output values from two first logic circuits, among the first logic circuits, in response to a selection signal;
a second logic circuit configured to output an address matching signal based on the selected output value, and to output values of remaining first logic circuits, except for the two first logic circuits;
a second non-volatile memory configured to store an address bit value corresponding to the selection signal;
a second selector configured to output one bit of address bits, corresponding to the two first logic circuits, in response to a true or inverted version of the selection signal; and
a third logic circuit configured to perform an AND operation on the address matching signal and an output value of the second selector.

4. The memory device of claim 3, wherein each of the first logic circuits is configured to perform an XNOR operation; and wherein the second logic circuit performs an AND operation.

5. The memory device of claim 3, wherein each of the first logic circuits is configured to perform an XOR operation; and wherein the second logic circuit performs a NAND operation.

6. The memory device of claim 3, wherein the received row address is a 16-bit row address; and
wherein each of the first selector and the second selector receives a first address bit and a sixteenth address bit, among the address bits of the row address.

7. The memory device of claim 3, wherein the second non-volatile memory stores a bit value of the sixteenth address bit as the address bit value ignored in a repair operation.

8. The memory device of claim 7, wherein the address bit value indicates one of the first repair unit and the second repair unit.

9. The memory device of claim 3, wherein the first repair circuit and the second repair circuit are set in a test operation.

10. An operating method of a memory device, comprising:
receiving a first row address indicating a wordline among first wordlines in a first bank and a second wordlines in a second bank;
receiving a second row address indicating a wordline among third wordlines in a third bank;
performing a first repair operation with a first repair unit when the first row address matches stored failed address;
performing a second repair operation with a second repair unit when the second row address matches stored failed address;
wherein the performing the first repair operation includes replacing wordlines of the first bank and the second bank with redundant wordlines simultaneously, and the performing the second repair operation includes replacing wordlines of the third bank with redundant wordlines; and
wherein the first repair unit is a 2n-wordline pair unit and the second repair unit is a 2-wordline pair unit, where "n" is a positive integer greater than one.

11. The method of claim 10, further comprising,
storing a bit value in a non-volatile memory for indicating one of the first repair unit and the second repair unit in a test operation.

12. The method of claim 10, wherein the first repair operation and the second repair operation ignore different address bits of a row address in corresponding repair operation.

13. The method of claim 10, wherein the first repair unit and the second repair unit are determined by a type of address bit and the number of the address bits.

14. The method of claim 10, further comprising,
storing repair mapping information of redundant cells regarding a type of address bit and the number of the address bits in a test operation.

15. A memory system, comprising:
at least one memory device; and
a controller configured to control the at least one memory device;
wherein the at least one memory device includes:
a plurality of banks including memory cells;
at least one redundant bank including redundant memory cells;
a repair control circuit configured to perform a repair operation of replacing a part of the memory cells with a part of the redundant memory cells when a row address bits store a failed address;
wherein the repair control circuit determines that wordlines of one bank of the plurality of banks are replaced or wordlines of two banks of the plurality of banks are replaced simultaneously according to a repair unit of the repair operation; and
wherein the repair unit is flexible according to a type of address bit or the number of the address bits in a test operation, and the repair includes a first repair unit as a 2n-wordline pair unit and a second repair unit as a 2-wordline pair unit, where "n" is a positive integer greater than one.

16. The memory system of claim 15, wherein the repair control unit includes:
   a first fuse circuit configured to perform a first repair operation by a first repair unit; and
   a second fuse circuit configured to perform a second repair operation by a second repair unit that is different from the first repair unit.

17. The memory system of claim 16, wherein each of the first repair circuit and the second repair circuit includes a non-volatile memory storing at least one address bit ignored in corresponding repair operation, among a plurality of address bits.

18. The memory system of claim 15, wherein the repair unit is independently set for all mappings.

19. The memory system of claim 15, wherein the repair unit be set to all mappings in common.

* * * * *